United States Patent [19]

Nath et al.

[11] Patent Number: 5,474,620

[45] Date of Patent: Dec. 12, 1995

[54] CUT RESISTANT LAMINATE FOR THE LIGHT INCIDENT SURFACE OF A PHOTOVOLTAIC MODULE

[75] Inventors: Prem Nath, Rochester Hills; Craig N. Vogeli, New Baltimore, both of Mich.

[73] Assignee: United Solar Systems Corporation, Troy, Mich.

[21] Appl. No.: 243,410

[22] Filed: May 16, 1994

[51] Int. Cl.[6] .................................... H01L 31/048
[52] U.S. Cl. ................. 136/251; 136/259; 437/2; 437/207; 437/224; 156/285; 156/299; 156/300; 156/307.1
[58] Field of Search ...................... 136/251, 259; 437/2–5, 207, 224; 156/285, 299–300, 307.1

[56] References Cited

U.S. PATENT DOCUMENTS 4,147,560  4/1979  Gochermann ..................... 136/251
5,238,519  8/1993  Nath et al. ........................ 156/382
5,273,608  12/1993 Nath .................................. 156/301

FOREIGN PATENT DOCUMENTS 55-1115   1/1980  Japan ................................ 136/251
60-1875   1/1985  Japan ................................ 136/251

Primary Examiner—Aaron Weisstuch
Attorney, Agent, or Firm—Gifford, Krass, Groh, Sprinkle, Patmore, Anderson & Citkowski

[57] ABSTRACT

A composite laminate specifically adapted to protect the light incident surface of a photovoltaic module from cuts which could create a short circuit includes a plurality of stacked layer pairs. The first layer of each pair is a glass fiber material and the second layer is a thermoplastic. The layers are disposed in a mutually interpenetrating relationship and topped with a thin transparent protective layer, such as a layer of a fluoropolymer. this combination of layer pairs has been demonstrated to provide sufficient protection to meet Underwriters Laboratories specifications (UL 1703 Section 23. Cut Test) for flat plate photovoltaic modules and panels.

16 Claims, 3 Drawing Sheets

CUT RESISTANT LAMINATE FOR THE LIGHT INCIDENT SURFACE OF A PHOTOVOLTAIC MODULE

FIELD OF THE INVENTION

This invention relates generally to the field of large area, thin film, light weight photovoltaic modules and more particularly to the field of encapsulants for the light incident surface of such photovoltaic modules, which encapsulants are characterized by the ability to withstand, pursuant to U.L. specifications, the cutting force of a sharp object drawn thereacross without shorting or exhibiting other electrical failure.

BACKGROUND OF THE INVENTION

Photovoltaic energy is becoming a very significant power source for several reasons. Fossil fuels are becoming scarcer, and hence, more expensive, everyday. Furthermore, the burning of fossil fuels releases pollutants, including greenhouse gases, which contribute to problems of global warming. Recent events have raised questions as to the safety and cost-effectiveness of nuclear power, and for these reasons such traditional energy sources are becoming less attractive. Photovoltaic energy, on the other hand, is inherently non-polluting, safe and silent. In addition, recent advances in photovoltaic energy have significantly increased the efficiency, and decreased the cost of such devices. For example, it is now possible to manufacture large area, thin film silicon and/or germanium alloy materials which manifest electrical, optical, chemical and physical properties equivalent, and in many instances superior to, their single crystalline counterparts. Layers of such alloys can be economically deposited at high speed over relatively large areas and in a variety of stacked configurations. Such alloys readily lend themselves to the manufacture of low cost photovoltaic devices. Some materials having particular utility in the fabrication of photovoltaic devices are described in U.S. Pat. Nos. 4,226,898 and 4,217,374, the disclosures of which are incorporated herein by reference. It will be appreciated that other thin film photovoltaic materials such as $CuInSe_2$, CdS materials and the like also have potential uses as photovoltaic devices.

As will be described in greater detail herein below, it is generally preferable to encapsulate or otherwise protect photovoltaic devices from cuts, abrasions and other ambient conditions, particularly when they are employed as power generating devices. The power producing photovoltaic installation will, of necessity, generate high electrical currents and/or voltages, and encapsulation provides the additional advantage of minimizing electrical shock hazards. Glass has been used as a protective material; however, glass is heavy and brittle, and can present a safety hazard if broken. Polymeric materials are lightweight and flexible; but such materials tend to be soft and easily cut; furthermore, their flexibility can cause them to be relatively thin in the region of thick structures such as bus bars, gridwires and the like, and this thinness will decrease cut resistance of the laminate. Various safety standards have been promulgated relative to photovoltaic devices concerning shock hazards resultant from inadvertent contact with the device, and in accord therewith, it is necessary that photovoltaic devices be resistant to cutting, penetration or abrasion. It will be appreciated that there is a need for encapsulant material which is capable of safely protecting a photovoltaic device. This encapsulant should also be low in cost, lightweight and not compromise the efficiency of the photovoltaic device.

The Underwriters Laboratory (UL) is a certifying organization which develops safety standards for a variety of products including photovoltaic devices. In order to better illustrate the operation and advantages of the encapsulant design of the present invention, the Underwriters Laboratories specifications will be enumerated in the following paragraphs. In publication UL 1703 entitled "Flat-Plate Photovoltaic Modules And Panels", Section 23, Underwriters Laboratories set forth the specifications for a "cut test" that must be met by flat panel photovoltaic modules, such as those for which the encapsulant of the instant invention was developed. That section reads as follows:

23.1 A module or panel shall be capable of withstanding the application of a sharp object drawn across its superstrate and substrate surfaces without creating a risk of electric shock.

23.2 The module or panel is to be positioned in a horizontal plane with the surface to be tested facing upward. The tool illustrated in FIG. 23.1 is to be placed on the surface for 1 minute, and then drawn across both the front and rear surfaces of the module or panel at a speed of 6±1.2 inches per second.

23.2 A risk of electric shock is considered to exist if either the blade of the tool contacts a part involving risk of electric shock, or if such a part is rendered accessible (transitory or permanent) as a result of the placement of the blade on or the drawing of the blade across the surface.

The Section 23 specification can be better understood by turning now to FIGS. 3–6 which correspond to FIG. 23.1 of the UL specification. In FIG. 3 the cut test tool is illustrated generally by the reference numeral 50. Tool 50 includes a generally rectangularly shaped frame formed by front brace 52a, back brace 52b, longitudinal side braces 52c and 52d, and four wheels 54 rotatably secured adjacent the ends of the longitudinal braces by bearing screws 56. A hook 58 secured to the back brace 52b provides means by which the tool can be rolled across the light incident surface of a photovoltaic module disposed therebelow. A rotatable support member 60 extends across and is affixed between the longitudinal braces 52c and 52d by elongated dowel pin 62. Secured to the central section of the support member 60 is an elongated rod 64 to which is affixed a screw 66 attaching a relatively sharply tipped instrumentality, such as a carbon steel strip (hacksaw blade) 68 and weighted blocks 70. For the purpose of specificity and referring to FIGS. 3–6, dimension A is about 7/8 inches from the axis to the center of the weight; dimension b is about 6⅝ inches from the axis to the test point; dimension C is about 0.025 inches and represents the thickness of the testing tip; and reference letter Q represents the total force exerted at the test point, i.e, at least two pounds.

The improved, cut resistant, composite encapsulant of the instant invention is specifically adapted to meet the Underwriters Laboratories specifications by withstanding at least two pounds of force when the test tool 50 is pulled across the surface thereof, while preventing the potential electrical shocks initiated thereby. Furthermore, the composite encapsulant is lightweight, low in cost, and highly transparent. These as well as other advantages of the instant invention will be readily apparent from the drawings, the detailed description thereof and the claims which follow hereafter.

BRIEF SUMMARY OF THE INVENTION

There is disclosed herein a composite laminate for a photovoltaic device comprising a plurality of layer pairs disposed in a superposed relationship upon the photovoltaic device. Each layer pair includes a sheet of glass fiber material and a layer of a thermoplastic polymer disposed in a coextensive and interpenetrating relationship, and a transparent, protective member disposed upon a light incident surface of a topmost one of the layer pairs.

The glass fiber layers may be made of woven or nonwoven fiber materials, typically in a thickness range of 2–8 mils. The thermoplastic material may comprise ethylene vinyl acetate, which may be in a thickness range of 10–25 mils. Generally, the thermoplastic polymer and glass fiber sheet will be compressed so as to be completely interpenetrating, without any voids. The composite laminant will include at least two layer pairs, and the transparent protective layer may be a fluoropolymer.

The present invention also includes a method whereby the composite laminate structure of the present invention may be affixed to a photovoltaic device.

DETAILED DESCRIPTION OF THE INVENTION

The Photovoltaic Cell

Figure 1A:
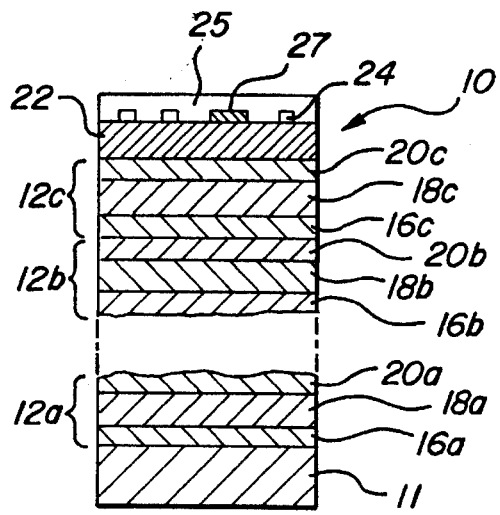
FIG. 1A is a fragmentary, cross-sectional view of a tandem photovoltaic device covered by the encapsulant of the instant invention, said device including a plurality of p-i-n type solar cells, each layer of the cells formed of a thin film amorphous silicon alloy material.

Referring now to the drawings and particularly to FIG. 1, there is depicted generally, by the reference numeral 10, a photovoltaic cell formed of at least one triad of successively deposited layers of p-i-n semiconductive material, each layer of which is in turn formed of, preferably, a thin film semiconductor alloy material. This device is representative of those which may be advantageously employed in combination with the present invention.

More particularly, FIG. 1 illustrates a p-i-n type photovoltaic device, such as a solar cell made up of individual p-i-n type cells 12a, 12b and 12c. Below the lowermost cell 12a is a substrate 11 which may be transparent or may be formed from a metallic material such as stainless steel, aluminum, tantalum, molybdenum, chrome, or metallic particles embedded within an insulator (cermets). Although certain applications may require a thin oxide layer and/or a series of base contacts prior to the deposition of the amorphous semiconductor alloy material, for purposes of the instant application, the term "substrate" shall include not only a flexible film, but also any elements added thereto by preliminary processing. Therefore, also included within the scope of the invention are substrates formed of glass or a glass-like material such as a synthetic polymeric resin on which an electrically conductive electrode is secured.

Each of the cells 12a, 12b, and 12c are preferably fabricated from a body of thin film semiconductor alloy material containing at least silicon and hydrogen. Each of the bodies of semiconductor alloy material includes an n-type layer of semiconductor alloy material 20a, 20b, and 20c; a substantially intrinsic layer of semiconductor alloy material 18a, 18b, and 18c; and a p-type layer of semiconductor alloy material 16a, 16b, and 16c. Note that the intrinsic layer may include traces of n-type or p-type dopant material without forfeiting its characteristic neutrality, hence it may be referred to as a "substantially intrinsic layer". It is worth noting that the layers of intrinsic semiconductor alloy material 18a, 18b, and 18c of the photovoltaic cells 12a, 12b, and 12c may be formed from semiconductor alloys of silicon having different band gaps tailored to photogenerate charge carriers in response to different wavelengths of light of the incident solar spectrum. For example, intrinsic layer 18c may have an optical band gap of approximately 1.7 electron volts (eV); intrinsic layer 18b may have a band gap of approximately 1.5 Ev; and intrinsic layer 18a may have a band gap of approximately 1.3 eV. Finally, as illustrated, solar cell 12b is an intermediate cell and as indicated in FIG. 1, additional intermediate solar cells may be stacked atop the illustrated cells without departing from the spirit or scope of the instant invention.

Also, although p-i-n type photovoltaic cells are depicted, the methods and materials of this invention may also be used to produce single or multiple n-i-p type solar cells, p-n type cells or devices, Schottky barrier devices, as well as other semiconductor elements and/or devices such as diodes, memory arrays, photoresistors, photodetectors, transistors, etc. The term "p-i-n type", as used herein, is defined to include any aggregation of n, i, and p layers operatively disposed to provide a photoresponsive region for generating charge carriers in response to absorption of photons if incident radiation.

It is to be understood that following the deposition of the successive layers of thin film semiconductor alloy material, a further deposition process may be either performed in a separate environment or as a pan of a continuous fabrication process. In this step, a layer of a transparent, electrically conductive oxide material 22 is deposited upon the light incident surface of the body of semiconductor alloy material. An electrode grid 24 made up of a matrix of a plurality of spacedly disposed grid fingers is affixed to the light incident surface of the photovoltaic cell in those instances wherein the cell is of sufficiently large area, or if the conductivity of the transparent conductive oxide material is insufficient to otherwise collect all photogenerated charge carriers. The matrix array of grid fingers is adapted to shorten the distance that said photogenerated charge carriers must travel and thereby increase photovoltaic conversion efficiency. Operatively positioned to extend transversely across the module and between the grid fingers 24 are a plurality of parallel bus bars 27, said bus bars electrically communicating with each of the grid fingers so as to collect current from the fingers and transport same to the terminal of the module. The bus bars and grid fingers may comprise metallic foils or wires adhered to the device by a conductive adhesive, or they may comprise patterns of printed conductive ink, or a combination of the foregoing. Finally, the multi-layered light incident laminate 25 of the instant invention disposed atop the grid finger and bus bar assemblies so as to hermetically seal same and protect same from electrical failures.

Figure 1C:
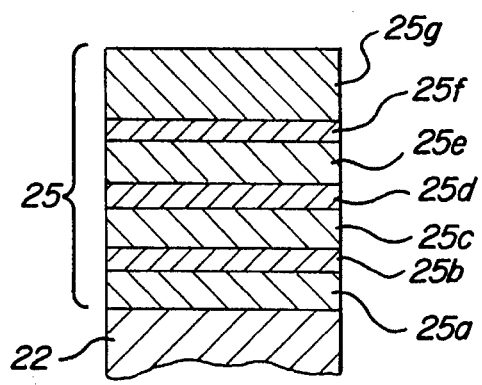
FIG. 1C is a fragmentary, cross-sectional view of the improved multi-layered, cut-resistant encapsulant of the instant invention which is affixed to the light incident surface of the photovoltaic cell illustrated in FIG. 1.
Figure 1B:
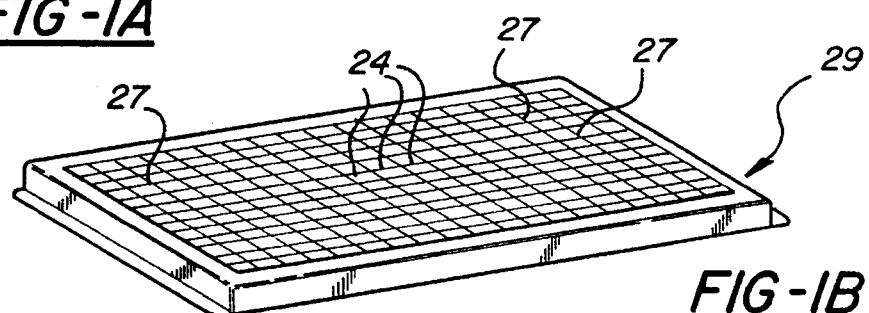
FIG. 1B is a perspective view of a photovoltaic module which includes the composite encapsulant of the instant invention.

Referring now to FIG. 1b, there is shown a completed, large area of photovoltaic power generating module 29, structured in accord with the present invention. Module 29 includes a number of photovoltaic devices, as generally illustrated in FIG. 1a. Visible in the drawing are grid fingers 24 and bus bars 27, as described above.

The Multi-Layered Laminate and the Underwriters Laboratory Test

Referring now to FIG. 1c, there is shown a cross sectional view of one embodiment of a composite encapsulant structured in accord with the present invention. The encapsulant 25 is shown affixed to the upper, transparent conductive electrode 22 of a photovoltaic device, generally similar to that shown in FIG. 1a.

The encapsulant 25 includes a plurality of layer pairs in a superposed relationship upon the device. The layer pairs each include a sheet of glass fiber material, for example, layers 25a, 25c, and 25e. Each pair further includes a layer of a thermoplastic polymer, for example, layers 25b, 25d, and 25f. While FIG. 1c shows three superposed layer pairs, it is to be understood that, within the context of the present invention, a larger or smaller number of layer pairs may be employed. Finally, the laminate includes a transparent, protective layer, for example, layer 25g disposed upon the light incident surface of a top most one of the layer pairs, in this instance, layer pair 25e and 25f.

The glass fiber material, for example, layer 25a, may comprise a sheet of woven fiberglass cloth, or it may comprise a sheet of non-woven fiberglass cloth, said terms being well known in the art. The sheet of glass fiber material may also comprise a plurality of fibers disposed in a generally parallel relationship. There is a wide range of fiber material which may be employed; however, it has been found that a layer of glass fiber material in the thickness range of 2–8 mils is generally preferred. One particularly preferred layer comprises a sheet of loosely woven glass fiber material of approximately 5 mils thickness sold by the Crane Corporation.

Figure 1D:
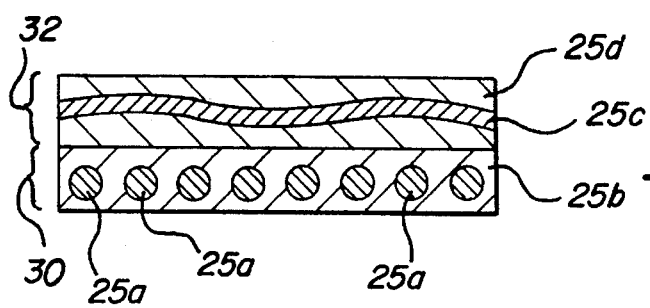
FIG. 1D is a fragmentary, cross-sectional view of two layer pairs of the composite encapsulant illustrating the interpenetration of the encapsulant and the thermoplastic.

Each layer pair further includes a layer of a thermoplastic polymer, and within the context of the present disclosure, said term is meant to include those polymers which may be, at least temporarily, rendered flowable by heat, it being understood that some such materials are subsequently heat cured into a non-flowable state. The sheet of glass fiber material and the layer of thermoplastic polymer are disposed in a generally coextensive and interpenetrating relationship so that the polymeric material penetrates the glass fiber sheet and surrounds the individual fibers. Referring now to FIG. 1d., there is shown a cross sectional view of two layer pairs 30, 32 in accord with the present invention. The first layer pair 30 includes a sheet of glass fiber material (shown here in cross sectional view so that individual fibers thereof are visible) and a layer of thermoplastic material 25b. The second layer pair 32 is generally similar, except that the sheet of glass fiber material 25c is disposed orthogonally to the glass fiber sheet 25a. of the first layer pair 30, and for that reason the cross sectional view depicts a single fiber of that sheet 25c. The second layer pair 32 further includes a thermoplastic layer 25d as described above. FIG. 1d specifically illustrates the fact that the layers are in an interpenetrating relationship and that the thermoplastic material has flowed around, and through the glass fiber sheet.

There are a variety of thermoplastic materials which may be employed in the practice of the present invention. The primary criteria are that the material have a high degree of optical transparency and that it be readily flowable under processing-conditions so as to permit interpenetration with the glass fiber layer. Furthermore, the polymeric materials should have a refractive index generally similar to that of the glass material so that light may pass readily therethrough without significant refraction or reflection at the polymer/glass interface. One particularly preferred material comprises an ethylene vinyl acetate copolymer (EVA). In general, the thermoplastic layer is approximately 10–25 mils thick and one particularly preferred thickness is 18 mils.

As illustrated in FIG. 1c, the composite encapsulant further includes a transparent, protective layer 25g disposed upon the light incident surface of the topmost one of the layer pairs. The transparent protective member 25g should be highly resistant to degradation by long exposure to ambient conditions and it should have sufficient integrity to seal and protect the underlying layers. Additionally, the protective layer should have a low adherence for soil deposits, so that such materials may be readily rinsed therefrom. One particularly preferred class of materials comprises fluoropolymers. These materials are transparent, highly inert, and resistant to soiling. One particularly preferred material is a copolymer of ethylene and tetrafluoroethylene sold by the DuPont Corporation under the trade name Tefzel®. Another protective material is a polyvinylidene fluoride sold by the DuPont Corporation under the name Tedlar®. Chlorinated polymers such as the material sold by The Allied Signal Corporation under the name Halar® may also be employed. While Tefzel® and similar materials have been previously employed as a protective cover for photovoltaic devices, the utility of such materials have been somewhat limited by their relatively high cost. The present invention confers a further advantage insofar as the structure thereof permits use of a relatively thin layer of Tefzel® encapsulant. In general, it has been found that in the present invention, a 1.5 mil thick sheet of Tefzel®, in conjunction with the aforementioned layer pairs, will provide a sturdy encapsulant. In contrast, prior art photovoltaic devices included Tedlar® layers of approximately 4 mils thickness. It should be understood that in accord with the present invention, various other transparent protective layers, including other flexible, polymeric layers, as well as rigid layers may also be employed.

The encapsulant of the present invention may be prepared by a variety of methods. For example, the structure of layer pairs may be laminated to the top, transparent protective member, and this assembly subsequently laminated, or otherwise affixed to the photovoltaic module. In other embodiments, the entire structure may be fabricated and laminated to the photovoltaic device in a single step.

Figure 2:
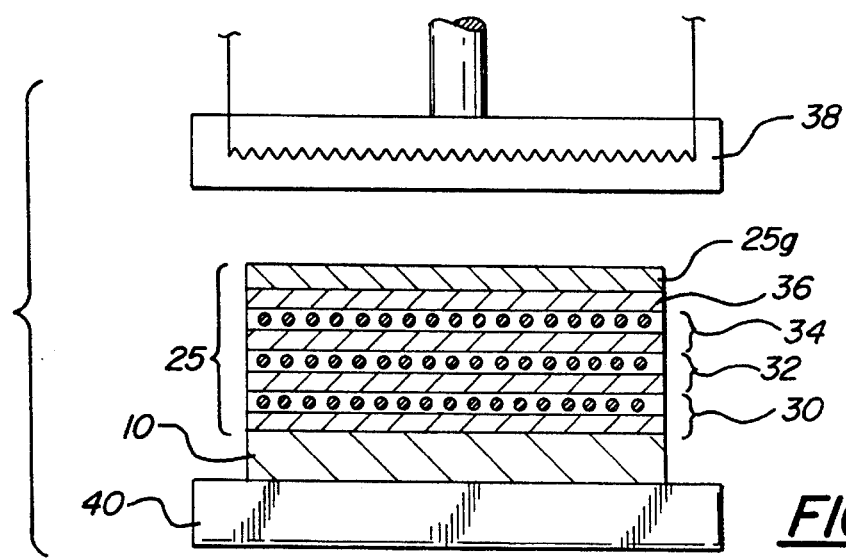
FIG. 2 is a stylized schematic view of a lamination process for the fabrication of the composite encapsulant of the present invention.

Referring now to FIG. 2, there is shown a schematic depiction of a lamination process wherein a photovoltaic device 10 is provided with an encapsulant 25, both generally similar to those depicted herein above. Specifically, the photovoltaic device 10 has three layer pairs 30, 32, and 34 stacked thereupon. As noted previously, each layer pair includes a layer of glass fiber material and a layer of thermoplastic material, and in the illustrated embodiment, these materials have not yet been placed in an interpenetrating relationship. A transparent, protective member 25g is disposed atop the layer pairs, and in the illustrated embodiment, an additional layer of thermoplastic material 36 is placed between the protective member 25g. and the top most layer pair 34.

The entire assembly is placed in a laminating press which includes a lower platen 40 and an upper platen 38, which in this embodiment is electrically heated. By applying heat and pressure, the various layers are laminated together to provide an encapsulant permanently adhered to the photovoltaic device 10. Frequently, it is desirable to evacuate excess air from the region between the photovoltaic device 10 and the various layers comprising the encapsulant 25. One laminating apparatus having particular utility in the present invention is that disclosed in U.S. Pat. No. 5,238,519, the disclosure of which is incorporated herein by reference.

Figure 3:
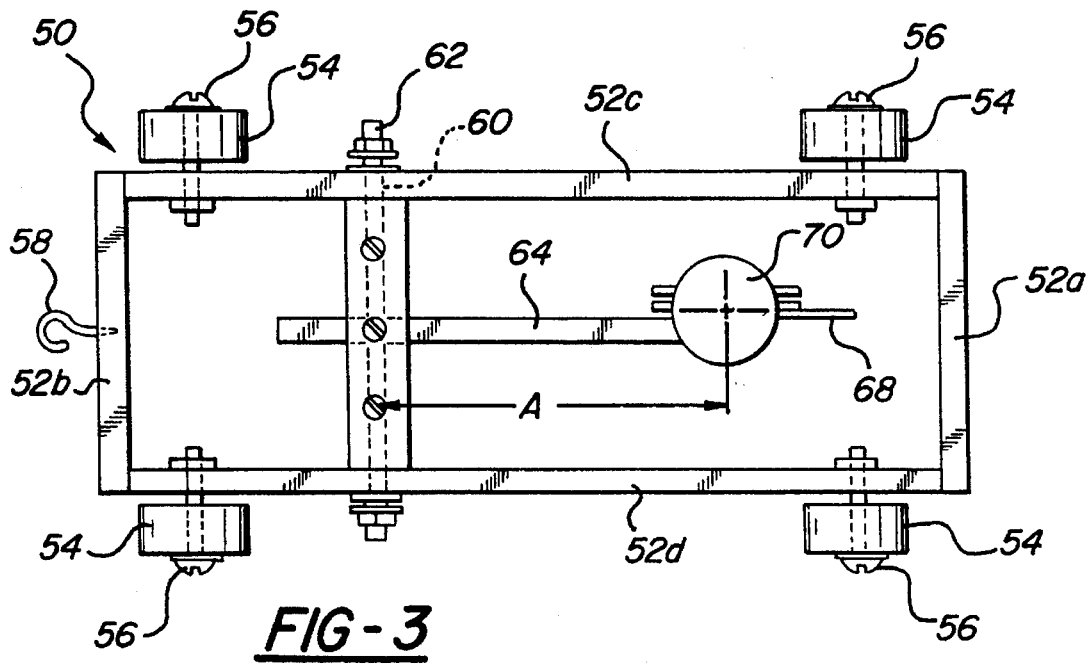
FIG. 3 is a top plan view illustrating the cut test tool which accompanies the Underwriters Laboratories specifications for describing the cut resistant behavior of flat-plate photovoltaic modules and panels.
Figure 4:
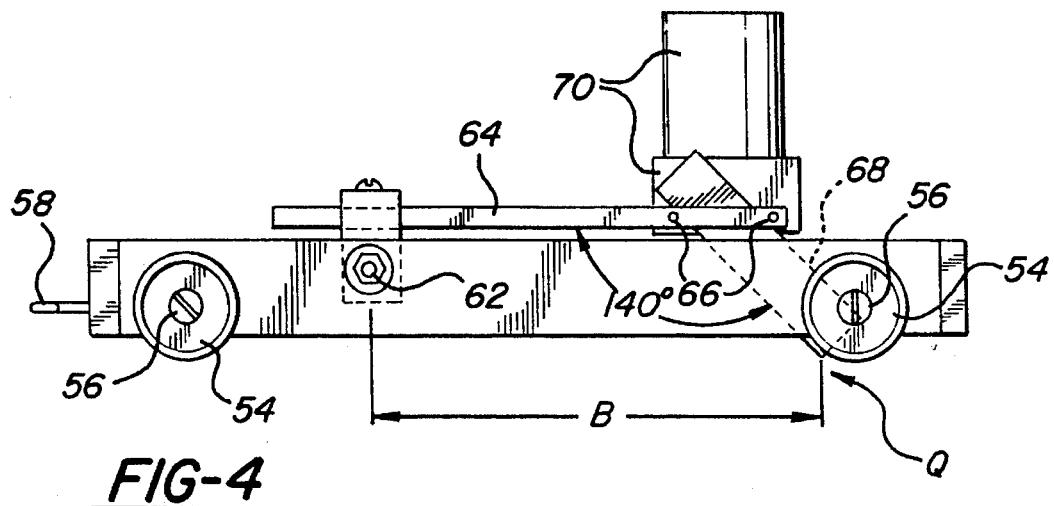
FIG. 4 is side elevational view of the cut test tool of FIG. 3 illustrating the impact point of the tool as operatively disposed above the light incident surface of a photovoltaic module.
Figure 5:
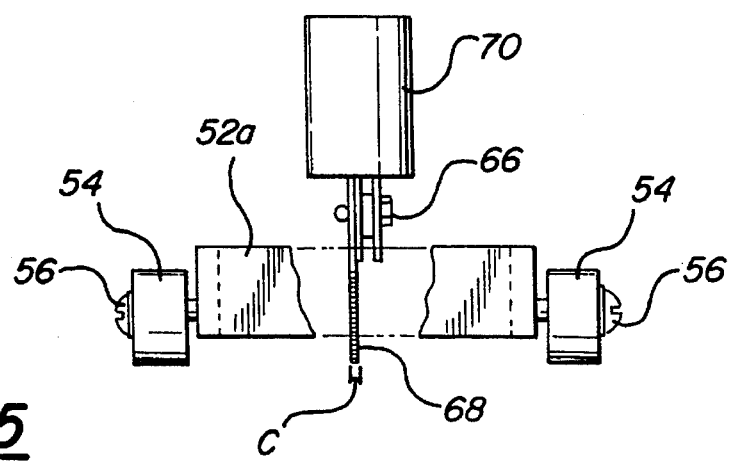
FIG. 5 is a front plan view, partially cut-away, of the cut test tool of FIG. 3 illustrating the thickness dimension of the cutting tool with the weight positioned thereabove.
Figure 6:
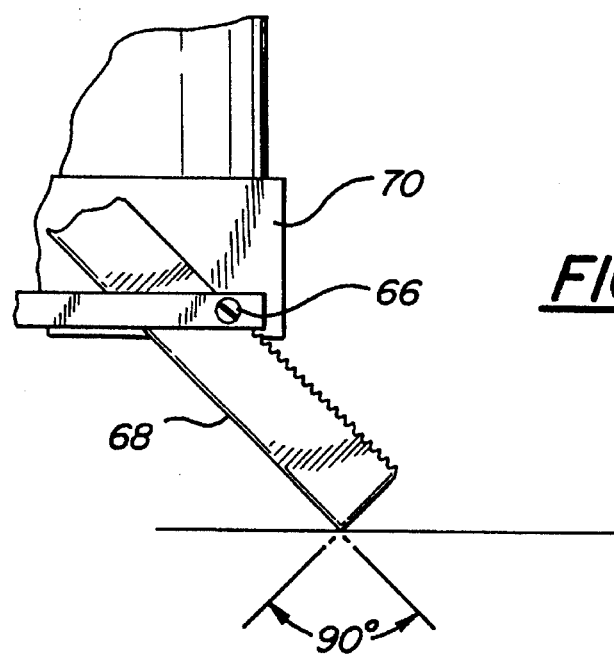
FIG. 6 is an enlarged side elevational view of the testing tool and weight assembly of the cut test tool of FIG. 3 illustrating the angle of the cutting tool relative to the light incident surface of the photovoltaic module disposed therebelow.
Figure 7:
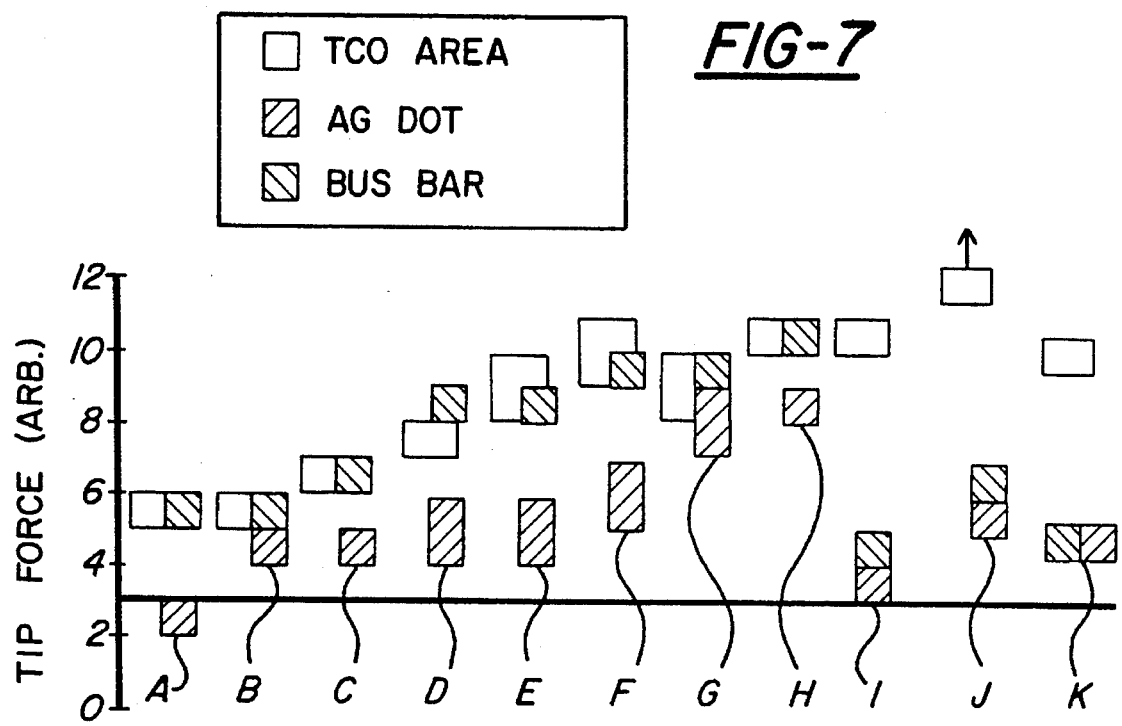
FIG. 7 is a graphic depiction of dam from an experimental series illustrating the advantage of the present invention.

Referring now to FIG. 7, there is depicted a graphical representation of an experimental series, illustrating the advantages of the present invention. The graph depicts the force applied at the tip 68 of a cutting tool 50 of the type illustrated in FIG. 3 on the vertical axis; and different encapsulant structures for hermetically sealing the light incident surface of the photovoltaic module are plotted on the horizontal axis. For each encapsulant structure, there is illustrated the force required to cut through to the TCO, bus bar, and silver paste connection region thereof. The horizontal line represents 3 pounds of force applied at the tip of cutting tool 68. While the UL specification only requires that the module be able to withstand 2 pounds of applied force, the 3 pound force level was selected as a minimum acceptable threshold for cut resistance. It was an analysis of these graphical results that directed the inventors hereof to select the multi-layered encapsulant 25 described and claimed herein.

In FIG. 7, data points bounded by the open squares represent measurements taken at the layer of transparent conductive oxide material 23 of the photovoltaic device. Those areas enclosed by the corresponding shaded squares represent measurements taken at the silver dots used to electrically interconnect the bus bars to the matrix of grid lines 24, and measurements taken at the region of the bus bars themselves. In this regard, it is important to note that, due to the different thicknesses thereof, each of these designated areas represent a different potential failure mechanism if the upper surface of the encapsulant 25 is penetrated by a sharp instrumentality drawn across the light incident surface of the photovoltaic module.

More particularly, the bus bars, which can either be fabricated of strips of wire or silver paste, are 20 mils and 4 mils thick, respectively, and the silver dots are fabricated from about 20 mils thick silver paste. Depending upon the exact portion of the light incident surface of the laminate 25 atop of which the cutting tool 68 is drawn, said tool will encounter a different subjacent part of the light incident current collection system. The data bounded by the squares in the FIG. 7 graph demonstrates the amount of force which each different one of the parts (bus bars, transparent conductive oxide, and silver dots) of the current collection system can withstand before shorting.

In the experimental series, photovoltaic devices generally similar to that illustrated in FIG. 1, were employed. Each device included a TCO top electrode and the devices for experiments A–H included bus bars fabricated from a printed silver paste as described above and the devices of experiments L–K included wire bus bars as previously described. In experiments A and B, the encapsulant comprised an EVA layer of 18 Mils thickness and a single layer of 5 Mil woven glass fabric, with a top protective Tefzel® layer of 1.5 Mils thickness; in experiment C, the encapsulant comprised EVA and glass as in experiments A and B, with a 2.5 Mil Tefzel® protective layer; in experiment D, the encapsulant comprised a 5 Mil woven glass fabric layer disposed between two 18 Mil EVA layers, with a 1.5 Mil Tefzel® protective layer; in experiment E, the encapsulant comprised an 18 Mil thick EVA layer, a 5 Mil fabric and a 4 Mil Tedlar® top protective layer; in experiment F, the encapsulant comprised a 5 Mil thick glass fabric layer disposed between two 18 Mil thick EVA layers, with a 2.5 Mil thick Tefzel® top layer; in Experiment G, the encapsulant comprised two 18 Mil thick EVA layers in an alternating relationship with two 5 Mil glass fabric layers, and a 1.5 Mil Tefzel® top layer; in experiment H, the encapsulant comprised a 5 Mil glass fiber layer disposed between two 18 Mil EVA layers and a 4 Mil Tedlar® top layer; in experiment I, the encapsulant comprised a series of layers as in experiment G; in experiment J, the encapsulant comprised three 5 Mil thick glass fabric layers and two 18 Mil thick EVA layers, with a 1.5 Mil thick Tefzel® layer on top, and it will be noted that the cut resistance of the TCO area is off the scale. In experiment K, the encapsulant comprised a series of layers as in experiments G and I.

In performing the scratch test in order to obtain the results graphically represented in FIG. 7, the following procedure was employed.

(1) a) The cut test tool 50 was aligned to a position parallel to the grid lines: b) The blade of the cutting tool was placed on the active area (the area not covered by grid lines or bus bars so as to be free for the passage of incident radiation into the body of photovoltaic material) of the light incident surface of the encapsulant 25; c) A two pound weight was placed on the weight assembly 70 of the cut test tool 50; d) 60 seconds were allowed to pass prior to moving the test tool; e) The cut test tool was drawn 1 inch across said light incident surface; f)and an electrically conductive mixture of water and an ionic surfactant as applied atop the scratch; g) The scratch mark was rubbed with a finger and an additional 10 seconds was allowed to pass; h) A potential of 30 volts was applied between an external lead and the surfactant solution; i) The current was measured and; j) the cut area was then dried and taped. Any measured current in excess of 2 microamps was taken as indicative of a failure of the encapsulant.

(2) The aforementioned steps numbers (1) a)–j) are then repeated at a bus bar region of the current collection system of the photovoltaic module. This is accomplished by initiating the scratch on one edge of the bus bar and drawing the cutting tool thereacross to the opposite side thereof.

(3) The aforementioned steps numbered (1) a)–j) above are then repeated at the silver dot region of the light incident current collection system of the photovoltaic module. This is accomplished by initiating the scratch on the peak of the dot and drawing the cutting tool toward the edge thereof.

(4) Steps (1) to (3) are repeated three times, using the same weight.

(5) The weight is then incremented by one pound and steps (1) to (4) are repeated.

It is the results of this test that are graphically tabulated in the plot illustrated in FIG. 7. As will be seen, the encapsulant of the present invention is very effective at preventing damage to photovoltaic devices occasioned by cuts, scrapes, and the like. The encapsulant is highly transparent and it meets or exceeds all UL specifications.

The foregoing drawings, description and discussion are meant to be illustrative of some particular embodiments of the instant invention. Other variations of the described embodiments may occur to those ordinarily skilled in the photovoltaic art without departing from the spirit or scope of the instant invention. It is therefore the claims that follow, including all equivalents thereof, which define the scope of the invention.

What is claimed is:

1. A cut-resistant laminated photovoltaic device comprising:

a plurality of layer pairs disposed in a superposed relation upon a light-incident surface of a photovoltaic device, each layer pair including a sheet of glass fiber material having a thickness in the range of 2–8 mils and a layer of a thermoplastic polymer having a thickness in the range of 10–25 mils disposed in a coextensive and interpenetrating relationship; and a transparent protective member disposed upon a light incident surface of a topmost one of said layer pairs.

2. A device as in claim 1, wherein said sheet of glass fiber material comprises a sheet of woven glass fiber material.

3. A device as in claim 1, wherein said sheet of glass fiber material comprises a sheet of non-woven glass fiber material.

4. A device as in claim 1, wherein said sheet of glass fiber material is approximately 5 mils thick.

5. A device as in claim 1, wherein said layer of thermoplastic polymer comprises a layer of ethylene vinyl acetate.

6. A device as in claim 1, wherein said sheet of glass fiber material and layer of thermoplastic polymer of each layer pair are disposed in a completely interpenetrating relationship so that no voids are present therein.

7. A device as in claim 1, including at least three sheets of glass fiber material.

8. A device as in claim 1, wherein said transparent protective member comprises a fluoropolymer.

9. A method for laminating a photovoltaic device, including the steps of:

providing a photovoltaic device;

providing a plurality of layer pairs, each layer pair including a sheet of a glass fiber material having a thickness in the range of 2–8 mils, and a layer of a thermoplastic polymer, having a thickness in the range of 10–25 mils. disposed in a coextensive relationship;

disposing a first one of said layer pairs upon a light incident surface of said photovoltaic device;

disposing a second one of said layer pairs upon said first one said layer pairs so as to form a layer pair stack;

disposing a transparent, protective member atop said layer pair stack; and laminating said protective member, layer pair stack, and photovoltaic device together so that the sheet of glass fiber material and the layer of thermoplastic polymer of each layer pair are put in a mutually interpenetrating relationship, and the layer stack is adhered to the photovoltaic device and the protective member.

10. A method as in claim 9, including the further step of disposing a third one of said layer pairs atop said second layer pair so as to form the layer pair stack.

11. A method as in claim 9, wherein the step of laminating said protective member comprises applying pressure to said protective member, layer pair stack, and photovoltaic device.

12. A method as in claim 9, wherein said step of laminating comprises applying heat to said protective member, layer pair stack, and photovoltaic device.

13. A method as in claim 9, wherein the step of providing a plurality of layer pairs comprises providing a plurality of layer pairs which include a sheet of woven glass fiber material of approximately 5 mils thickness.

14. A method as in claim 9, wherein the step of providing a plurality of layer pairs comprises providing a plurality of layer pairs including a layer of ethylene vinyl acetate thermoplastic polymer of approximately 18 mils thickness.

15. A method as in claim 9, wherein the step of providing a photovoltaic device comprises providing a flexible, thin film photovoltaic device.

16. A method for laminating a photovoltaic device, including the steps of:

providing a photovoltaic device;

providing at least three sheets of a glass fiber material having a thickness in the range of 2–8 mils;

providing a plurality of layers of a thermoplastic material having at thickness in the range of 10–25 mils;

disposing each of said layers in a coextensive relationship with a respective one of said sheets so as to form a layer pair stack;

disposing a transparent, protective member atop said layer pair stack; and laminating said protective member, layer pair stack, and photovoltaic device together so that the sheet of glass fiber material and the layer of thermoplastic polymer of each layer pair are put in a mutually interpenetrating relationship, the layer stack is adhered to the photovoltaic device and the protective member.

* * * * *